(12) United States Patent
Ohkuri et al.

(10) Patent No.: US 8,150,067 B2
(45) Date of Patent: Apr. 3, 2012

(54) BASS ENHANCING METHOD, SIGNAL PROCESSING DEVICE, AND AUDIO REPRODUCING SYSTEM

(75) Inventors: Kazunobu Ohkuri, Kanagawa (JP); Taro Nakagami, Kanagawa (JP); Masaru Shimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1002 days.

(21) Appl. No.: 12/075,538

(22) Filed: Mar. 12, 2008

(65) Prior Publication Data

US 2008/0273718 A1 Nov. 6, 2008

(30) Foreign Application Priority Data

Mar. 16, 2007 (JP) ................................. 2007-068093

(51) Int. Cl.
*H03G 5/00* (2006.01)
(52) U.S. Cl. ................................. 381/98; 381/61; 700/94
(58) Field of Classification Search .................... 381/98, 381/56, 61, 63; 700/94
See application file for complete search history.

(56) References Cited

U.S. PATENT DOCUMENTS

| 4,467,287 A | 8/1984 | Aylward |
| 4,641,361 A | 2/1987 | Rosback |
| 6,084,974 A | 7/2000 | Niimi |
| 6,285,767 B1 * | 9/2001 | Klayman .......................... 381/17 |
| RE38,822 E * | 10/2005 | Aarts et al. ........................ 381/61 |
| 7,317,800 B1 * | 1/2008 | Vierthaler et al. ............... 381/61 |
| 2005/0002534 A1 * | 1/2005 | Aubauer et al. ................... 381/1 |
| 2005/0071028 A1 * | 3/2005 | Yuen et al. ........................ 700/94 |
| 2006/0262938 A1 * | 11/2006 | Gauger et al. ................... 381/56 |

FOREIGN PATENT DOCUMENTS

| JP | 58-063289 A | 4/1983 |
| JP | 59-221017 A | 12/1984 |
| JP | 04-072903 A | 3/1992 |
| JP | 2000-286750 A | 10/2000 |
| JP | 2003-032058 A | 1/2003 |
| JP | 2007-178675 A | 7/2007 |

* cited by examiner

*Primary Examiner* — Zandra Smith
*Assistant Examiner* — Errol Fernandes
(74) *Attorney, Agent, or Firm* — Wolf, Greenfield & Sacks, P.C.

(57) ABSTRACT

If the absolute value of the current sample is greater than or equal to an envelope value at the immediately preceding sample, an envelope value at the current sample is made greater than the envelope value at the immediately preceding sample. If the absolute value of the current sample is smaller than the envelope value at the immediately preceding sample and a count value C does not reach a predetermined number N, the count value C is incremented by one and the envelope value at the current sample is held at the envelope value at the immediately preceding sample. If the absolute value of the current sample is smaller than the envelope value at the immediately preceding sample and the count value C reaches the predetermined number N, the envelope value at the current sample is made smaller than the envelope value at the immediately preceding sample.

11 Claims, 10 Drawing Sheets

BASS ENHANCING METHOD, SIGNAL PROCESSING DEVICE, AND AUDIO REPRODUCING SYSTEM

CROSS REFERENCES TO RELATED APPLICATIONS

The present invention contains subject matter related to Japanese Patent Application JP 2007-068093 filed in the Japanese Patent Office on Mar. 16, 2007, the entire contents of which are incorporated herein by reference.

BACKGROUND OF THE INVENTION

1. Field of the Invention

The present invention relates to a bass enhancing method and circuit for enhancing a bass component of an audio signal, and to an audio reproducing system including the bass enhancing circuit and an electric audio transducer, such as a speaker or headphones.

2. Description of the Related Art

Figure 8:
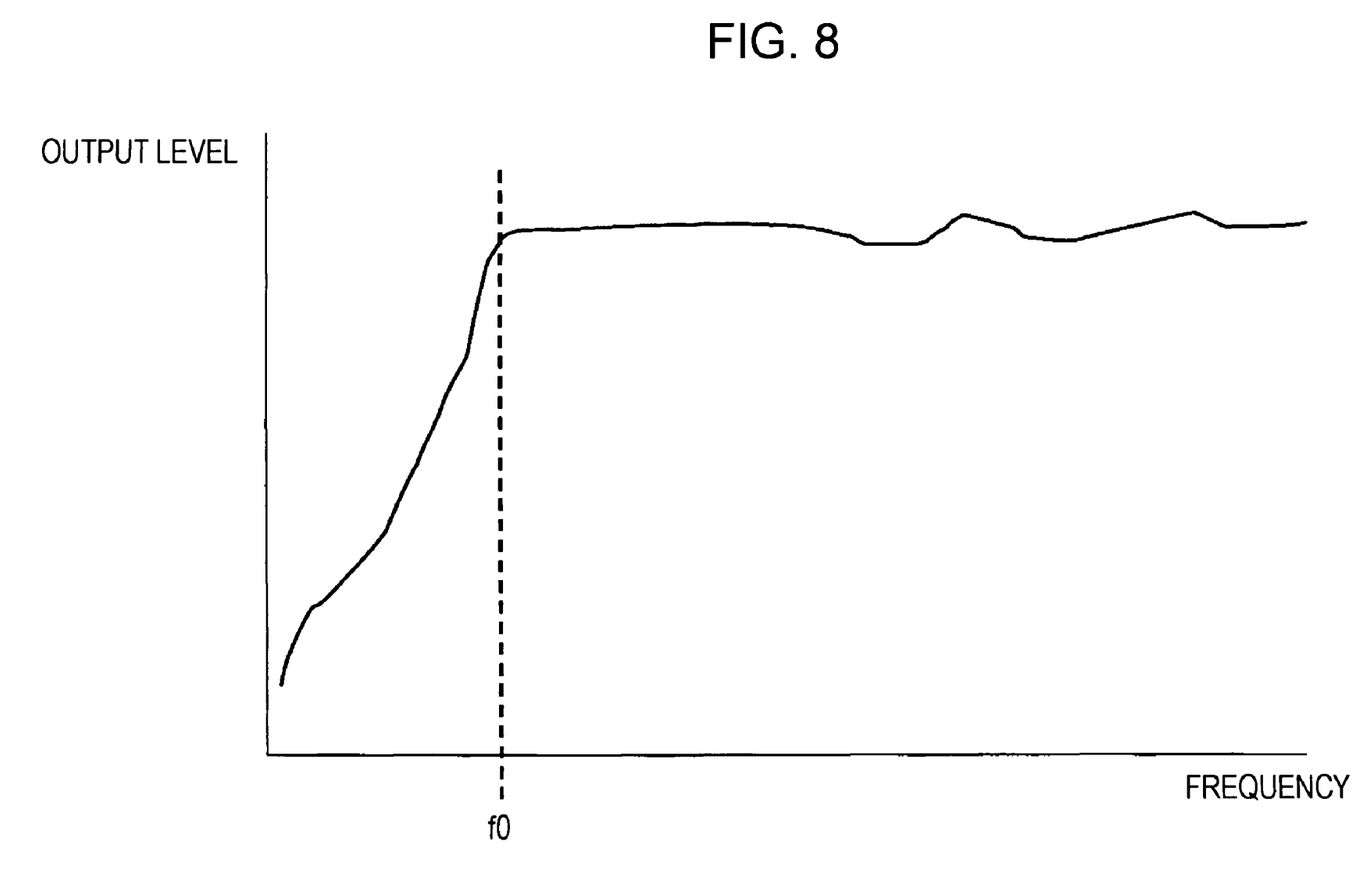
FIG. 8 is a graph showing an exemplary frequency characteristic of a speaker.

FIG. 8 shows a frequency characteristic of a compact speaker used, for example, in an active speaker having a power amplifier circuit. As shown in FIG. 8, the output level of the compact speaker decreases in the frequency range below a lowest reproduction frequency f0. The lowest reproduction frequency f0 (e.g., about 100 Hz) is typically within an audible frequency range.

Therefore, by enhancing a bass component at about or below the lowest reproduction frequency f0 in an audio signal, it is possible to produce a rich bass sound.

Figure 9:
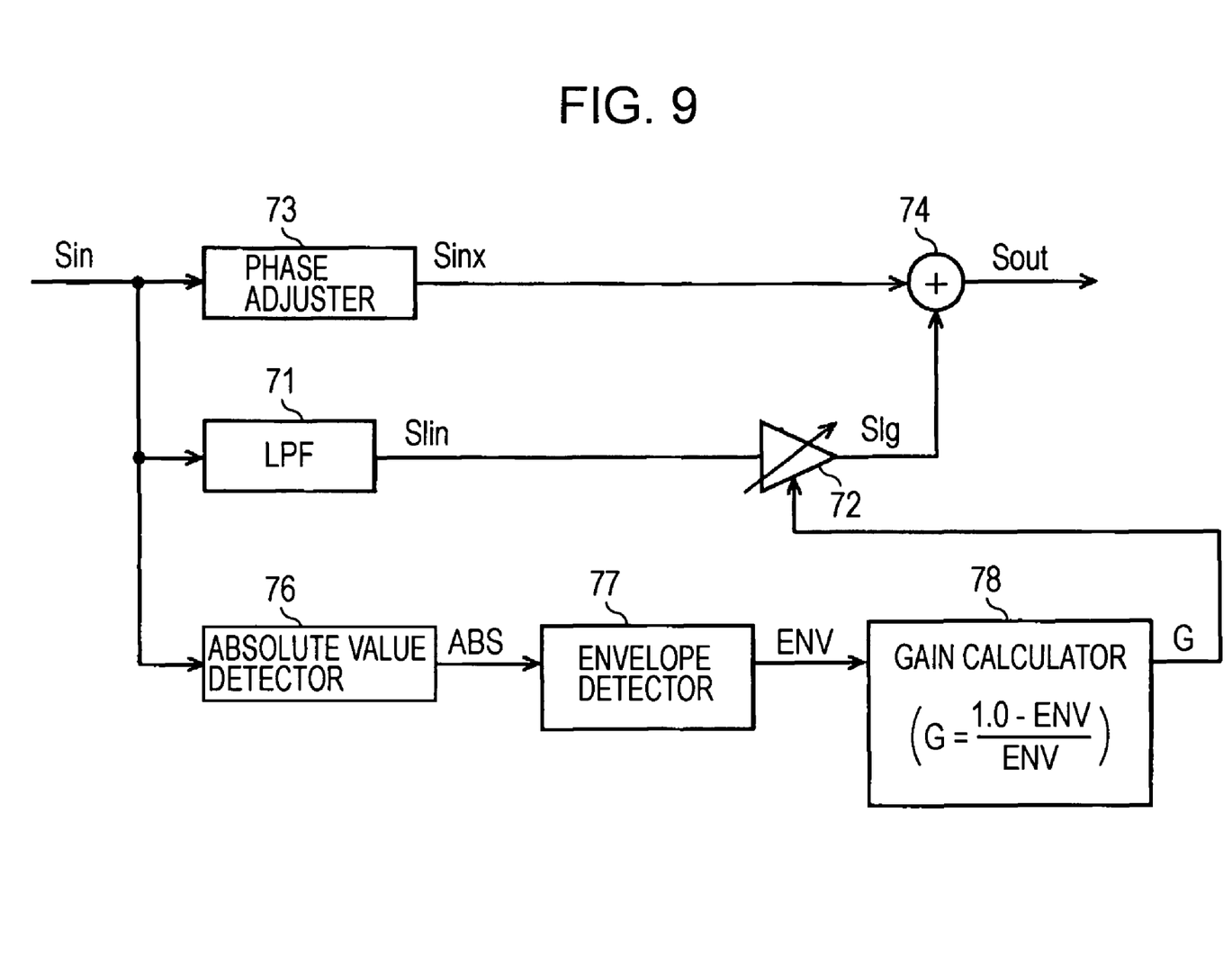
FIG. 9 illustrates a bass enhancing circuit according to a related art.
Figure 10:
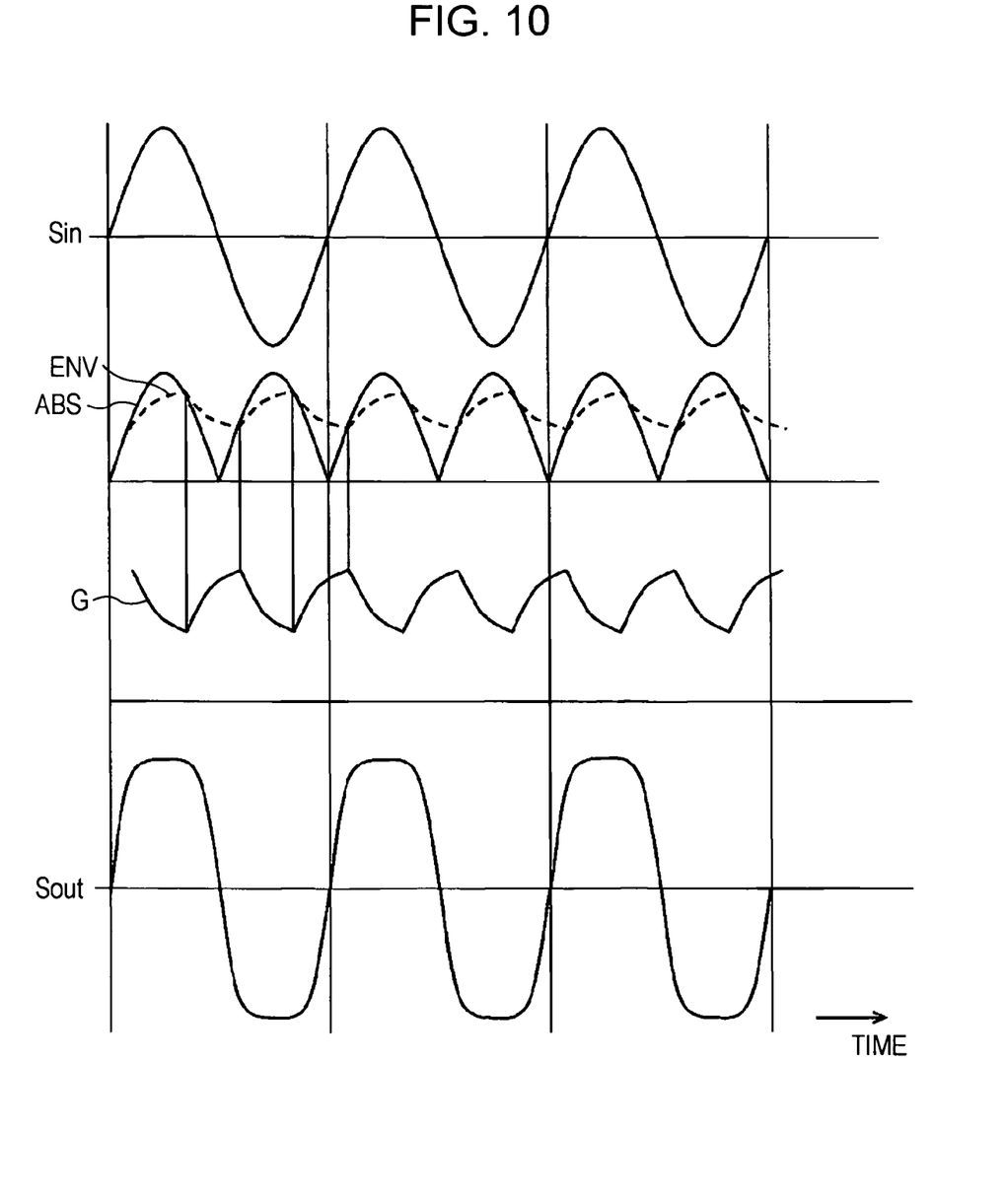
FIG. 10 is a graph showing exemplary signals obtained in the bass enhancing circuit of FIG. 9.

FIG. 9 and FIG. 10 illustrate an example of such a bass enhancing method.

In a bass enhancing circuit illustrated in FIG. 9, a low-pass filter (LPF) 71, for example, having a cutoff frequency slightly higher than f0 (100 Hz) extracts a bass component Slin of an input audio signal Sin (see FIG. 10), and a multiplier 72 multiplies the bass component Slin by a gain G calculated as described below. That is, the bass component Slin is amplified by the calculated gain G.

Additionally, in a manner to compensate for a phase delay in the low-pass filter 71 and the multiplier 72, a phase adjuster 73 adjusts the phase of the input audio signal Sin. Then, an adder 74 adds an audio signal Sinx obtained by the phase adjustment and a bass component Slg output from the multiplier 72. Thus, an output audio signal Sout in which only a bass component is enhanced is obtained.

The gain G is calculated by an absolute value detector 76, an envelope detector 77, and a gain calculator 78.

Specifically, the absolute value detector 76 detects the absolute value of the input audio signal Sin and obtains an absolute value ABS shown in FIG. 10. Subsequently, the envelope detector 77 detects an envelope of the absolute value ABS through an attack process and a release process and obtains an envelope value ENV indicated by a dashed line in FIG. 10.

Then, for example, if the input audio signal Sin is a digital signal and a full-bit or maximum level of the digital signal is 1.0 (0 dB), the gain calculator 78 uses the equation shown in FIG. 9 to calculate the gain G.

Thus, as shown in FIG. 10, the gain G gradually decreases during the attack time in which the envelope value ENV gradually increases, while the gain G gradually increases during the release time in which the envelope value ENV gradually decreases.

Then, as described above, the multiplier 72 multiplies the bass component Slin by the gain G, and the adder 74 adds the bass component Slg obtained by the multiplication to the audio signal Sinx obtained by the phase adjustment. Thus, as shown in the bottom part of FIG. 10, a bass component of the output audio signal Sout is enhanced.

If the input audio signal Sin is a digital signal, the bass enhancing circuit is configured as a digital processing circuit in which, for example, the low-pass filter 71 is realized as a finite impulse response (FIR) filter or an infinite impulse response (IIR) filter and the phase adjuster 73 is realized as a delay circuit or an all-pass filter (APF).

As an input to the absolute value detector 76, the audio signal Sinx obtained by phase adjustment or the output audio signal Sout may be used.

Japanese Unexamined Patent Application Publication No. 2000-286750 discloses a method of controlling the level of a digital signal, such as a digital audio signal. This method involves a process in which the absolute value of an input digital signal is converted to a gain value according to level control, the values of attack time and release time are added to the gain value, an envelope of the gain value is detected, and the input digital signal is multiplied by the envelope value.

SUMMARY OF THE INVENTION

In the bass enhancing method illustrated in FIG. 9 and FIG. 10, the envelope value ENV constantly fluctuates, which causes the gain G to also constantly fluctuate, as shown in FIG. 10. As a result, as shown in the bottom part of FIG. 10, the waveform of the output audio signal Sout is distorted, which is particularly significant in bass components.

If the periods of attack time and release time in envelope detection are increased and thus, the envelope value ENV becomes substantially constant with respect to a certain level of a sinusoidal input audio signal, it is possible to obtain an output audio signal with less distortion.

However, when the period of attack time in envelope detection is increased, if the level of the input audio signal Sin abruptly increases and the absolute value ABS also abruptly increases, the resulting increase in envelope value ENV causes a delay in reduction of the gain G, causes data to overflow for a long time, and thus causes noise.

On the other hand, when the period of release time in envelope detection is increased, if the level of the input audio signal Sin abruptly decreases and the absolute value ABS also abruptly decreases, the resulting decrease in envelope value ENV causes the gain G to increase, and it takes a long time before the effect of enhancing a bass component is recovered.

Accordingly, it is desirable to achieve bass enhancement without causing distortion in signal waveform while allowing a quick response to a change in the level of an audio signal.

A bass enhancing method according to an embodiment of the present invention includes the steps of detecting an envelope of an absolute value of an audio signal, and amplifying a bass component of the audio signal by a gain calculated from the detected envelope value so as to enhance the bass component of the audio signal. In the envelope detection performed with respect to each sample of the audio signal sampled at a predetermined sampling frequency, (a) if the absolute value of the current sample is greater than or equal to an envelope value at the immediately preceding sample, a count value C indicating the number of samples is set to zero, while an envelope value at the current sample is made greater than the envelope value at the immediately preceding sample;

(b) if the absolute value of the current sample is smaller than the envelope value at the immediately preceding sample and the count value C does not reach a predetermined number N, the count value C is incremented by one and the envelope value at the current sample is held at the envelope value at the immediately preceding sample; and (c) if the absolute value of the current sample is smaller than the envelope value at the immediately preceding sample and the count value C reaches the predetermined number N, the envelope value at the current sample is made smaller than the envelope value at the immediately preceding sample.

In the bass enhancing method described above, if the absolute value of the current sample is smaller than the envelope value at the immediately preceding sample and the count value C does not reach a predetermined number N, the envelope value at the current sample is held at the envelope value obtained at the immediately preceding sample. This means that a gain at the current sample is also held at a gain obtained at the immediately preceding sample. Therefore, it is possible to prevent a gain from constantly fluctuating and thus to prevent the waveform of a bass-enhanced audio signal from being distorted.

Moreover, if the absolute value of the current sample is greater than or equal to the envelope value at the immediately preceding sample, the envelope value at the current sample is increased, as an attack process, such that it follows a change in the absolute value. Therefore, even when the level of an audio signal abruptly increases, a gain quickly follows the change in the level of the audio signal, the effect of enhancing a bass component is suppressed, and generation of noise caused by data overflow is prevented.

Additionally, when the count value C indicating the number of samples reaches the predetermined number N, if the absolute value of the current sample is smaller than the envelope value at the immediately preceding sample, the envelope value at the current sample is reduced, as a release process, such that it follows a change in the absolute value. Therefore, even when the level of an audio signal abruptly decreases, a gain quickly follows the change in the level of the audio signal and thus, the effect of enhancing a bass component is recovered.

As described above, the present invention makes it possible to achieve bass enhancement without causing significant distortion in signal waveform while allowing a quick response to a change in the level of an audio signal.

DESCRIPTION OF THE PREFERRED EMBODIMENTS

Figure 1:
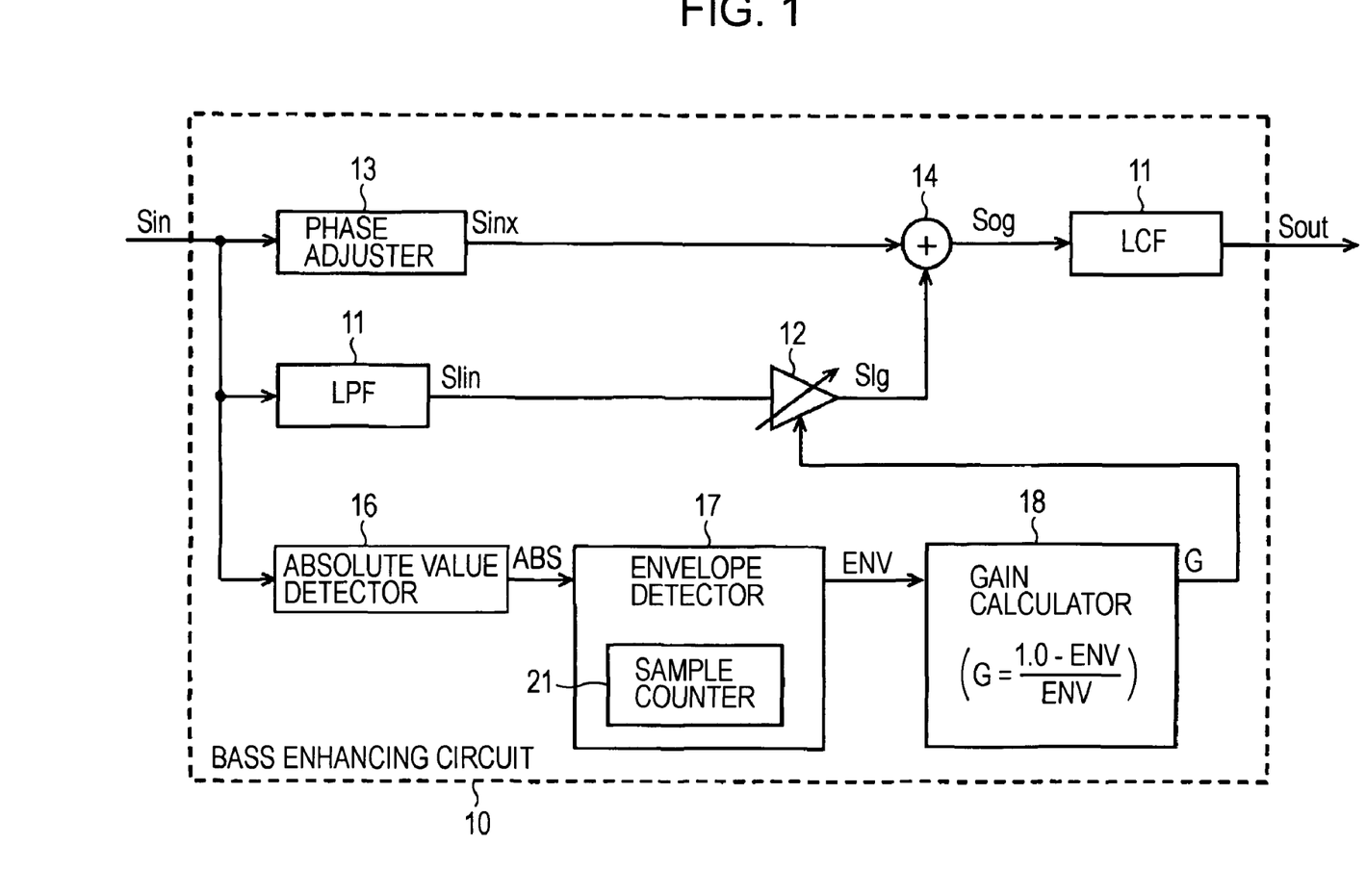
FIG. 1 illustrates an exemplary bass enhancing circuit according to an embodiment of the present invention.

1. Configuration of Bass Enhancing Circuit: FIG. 1

FIG. 1 illustrates an exemplary bass enhancing circuit according to an embodiment of the present invention.

A bass enhancing circuit 10 of this example includes a low-pass filter (LPF) 11, a multiplier 12, a phase adjuster 13, an adder 14, a low-cut filter (LCF) 15, an absolute value detector 16, an envelope detector 17, and a gain calculator 18.

An input audio signal Sin is a digital audio signal (audio data) having a predetermined sampling frequency fs. The bass enhancing circuit 10 is configured as a digital processing circuit in which, for example, the low-pass filter 11 is realized as an FIR filter or an IIR filter and the phase adjuster 13 is realized as a delay circuit or an APF.

The cutoff frequency of the low-pass filter 11 is set to a value slightly higher than a lowest reproduction frequency f0 of a speaker to which an audio signal subjected to bass enhancement by the bass enhancing circuit 10 is supplied. For example, if the lowest reproduction frequency f0 is 100 Hz, the cutoff frequency of the low-pass filter 11 is set to 150 Hz. The cutoff frequency of the low-cut filter 15 is set to be smaller than or equal to the lowest reproduction frequency f0.

In the bass enhancing circuit 10 of this example, the low-pass filter 11 extracts a bass component Slin from the input audio signal Sin, and the multiplier 12 multiplies the bass component Slin by a gain G calculated as described below. In other words, the bass component Slin is amplified by the calculated gain G.

Additionally, in a manner to compensate for a phase delay in the low-pass filter 11 and the multiplier 12, the phase adjuster 13 adjusts the phase of the input audio signal Sin. The adder 14 adds an audio signal Sinx obtained by the phase adjustment and a bass component Slg output from the multiplier 12. Then, the low-cut filter 15 attenuates a bass component of an audio signal Sog output from the adder 14. Thus, an output audio signal Sout is obtained.

For level detection of the input audio signal Sin, the absolute value detector 16 detects an absolute value ABS of the input audio signal Sin, and the envelope detector 17 detects an envelope of the absolute value ABS. In the present embodiment, the envelope detector 17 executes the envelope detection by a process described below.

From an envelope value ENV output from the envelope detector 17, for example, if a full-bit or maximum level of the input audio signal Sin is 1.0 (0 dB), the gain calculator 18 uses the equation shown in FIG. 1 to calculate the gain G. As is apparent, the smaller the envelope value ENV, the greater the gain G.

Although the low-cut filter 15 may be removed, the effect described below can be obtained by providing the low-cut filter 15.

The audio signal Sinx obtained by phase adjustment, the audio signal Sog output from the adder 14, or the output audio signal Sout output from the low-cut filter 15 may be used as an input to the absolute value detector 16. However, the following description refers to the case where the input audio signal Sin is used, as in the case of the example illustrated in FIG. 1.

2. Envelope Detection and Bass Enhancing Method: FIG. 2 to FIG. 6

Figure 2:
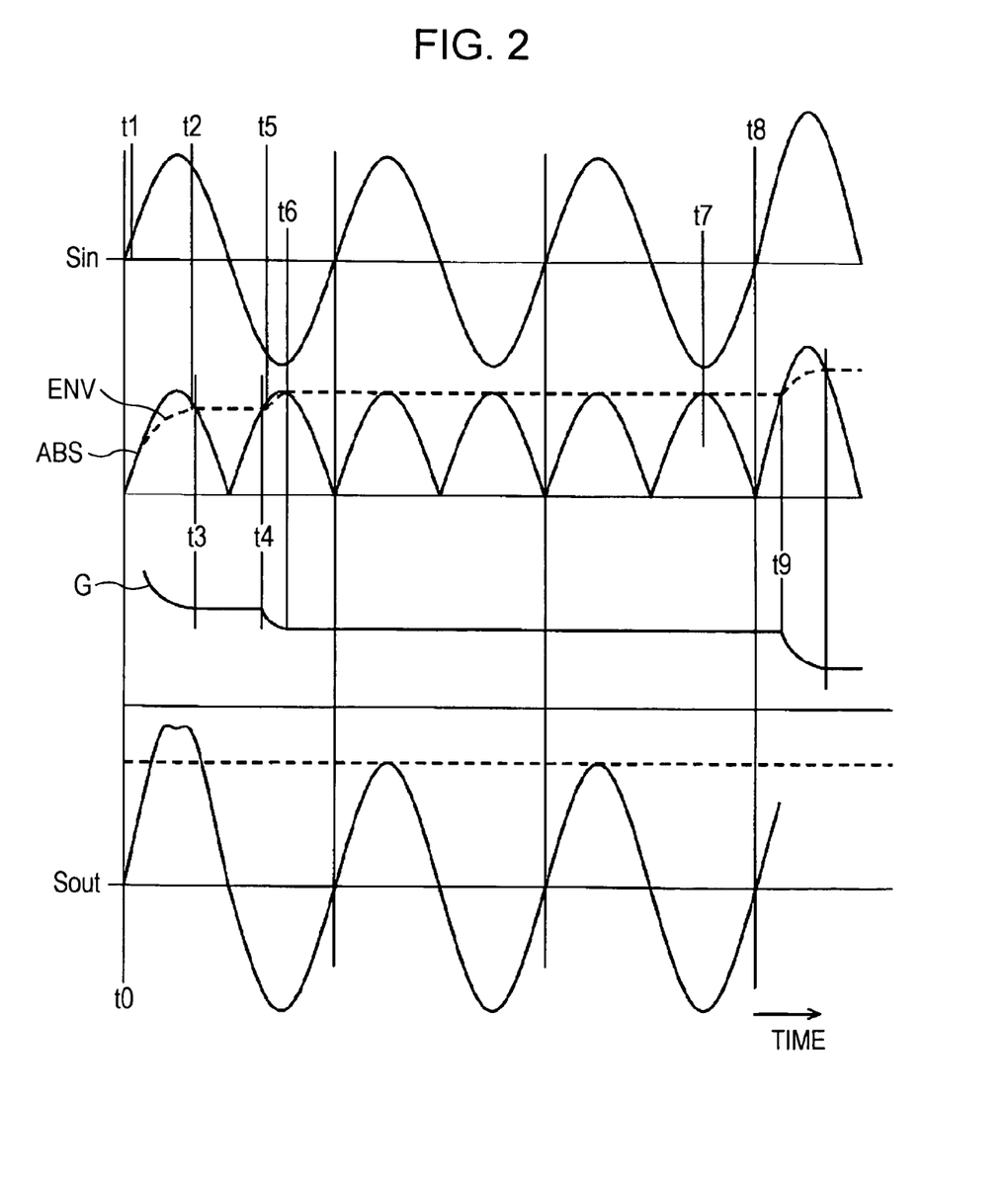
FIG. 2 is a graph showing exemplary signals obtained in the bass enhancing circuit of FIG. 1.

FIG. 2 shows analog waveforms of exemplary signals obtained in the bass enhancing circuit 10 of FIG. 1, and thus illustrates envelope detection performed by the envelope detector 17.

Initially, at time point t0 immediately before the input audio signal Sin is supplied to the bass enhancing circuit 10, a count value C of a sample counter 21 in the envelope detector 17 is set to zero, and the envelope value ENV output from the envelope detector 17 is also set to zero.

Then, at time point t1 where the initial sample of the input audio signal Sin is supplied to the bass enhancing circuit 10 and the absolute value detector 16 detects an absolute value ABS of the initial sample, since the absolute value ABS of the sample exceeds an envelope value ENVs (i.e., zero) obtained at time point t0 immediately before time point t1, the envelope detector 17 increases the envelope value ENV during a predetermined period of attack time while holding the count value C at zero. Hereinafter, this process is referred to as attack process.

At each sample time point during the period from time point t1 to time point t2, since the absolute value ABS of the current sample is greater than or equal to the envelope value ENVs at the immediately preceding sample, the count value C is set to zero and the envelope value ENV is increased through the attack process.

Then, at time point t3 immediately after time point t2, when the absolute value ABS of the current sample falls below the envelope value ENVs obtained at the immediately preceding sample, the count value C is set to one, and at the same time, the envelope value ENV at the current sample is held at the envelope value ENVs obtained at the immediately preceding sample. Hereinafter, this process is referred to as hold process.

At each sample time point during the period from time point t3 to time point t4, since the absolute value ABS of the current sample is smaller than the envelope value ENVs obtained at the immediately preceding sample, the count value C is incremented by one while the envelope value ENV at the current sample is continuously held at the envelope value ENVs obtained at the immediately preceding sample.

Then, at time point t5 immediately after time point t4, when the absolute value ABS of the current sample reaches the envelope value ENVs obtained at the immediately preceding sample, the count value C is set to zero and, as the attack process, the envelope value ENV is increased during a predetermined period of attack time.

Then, up to the sample time point immediately before time point t6, the envelope value ENV is increased through the attack process while the count value C is held at zero. However, during the period from time point t6 to time point t7, the hold process described above is executed at every sample point, except some points (including time point t6 and time point t7) at which the absolute value ABS reaches its maximum value. Thus, the envelope value ENV is held constant, and the gain G is also held constant.

Therefore, as shown in the bottom part of FIG. 2, the waveform of the output audio signal Sout is not distorted in any period, except the period of the initial wave.

Additionally, at time point t8 after time point t7 in FIG. 2, there is an abrupt increase in the level of the input audio signal Sin.

In the period from time point t8, the level of the input audio signal Sin and the absolute value ABS change, as shown in FIG. 2. Then, at time point t9 where the count value C that started increasing at time point t7 does not yet reach a predetermined number N, if the absolute value ABS of the current sample reaches the envelope value ENVs obtained at the immediately preceding sample, the count value C is reset to zero at time point t9, and at the same time, the envelope value ENV is increased through the attack process.

Thus, in a short time, the gain G changes in response to a change in the level of the input audio signal Sin, the effect of enhancing a bass component is suppressed, and generation of noise caused by data overflow is prevented.

Figure 3:
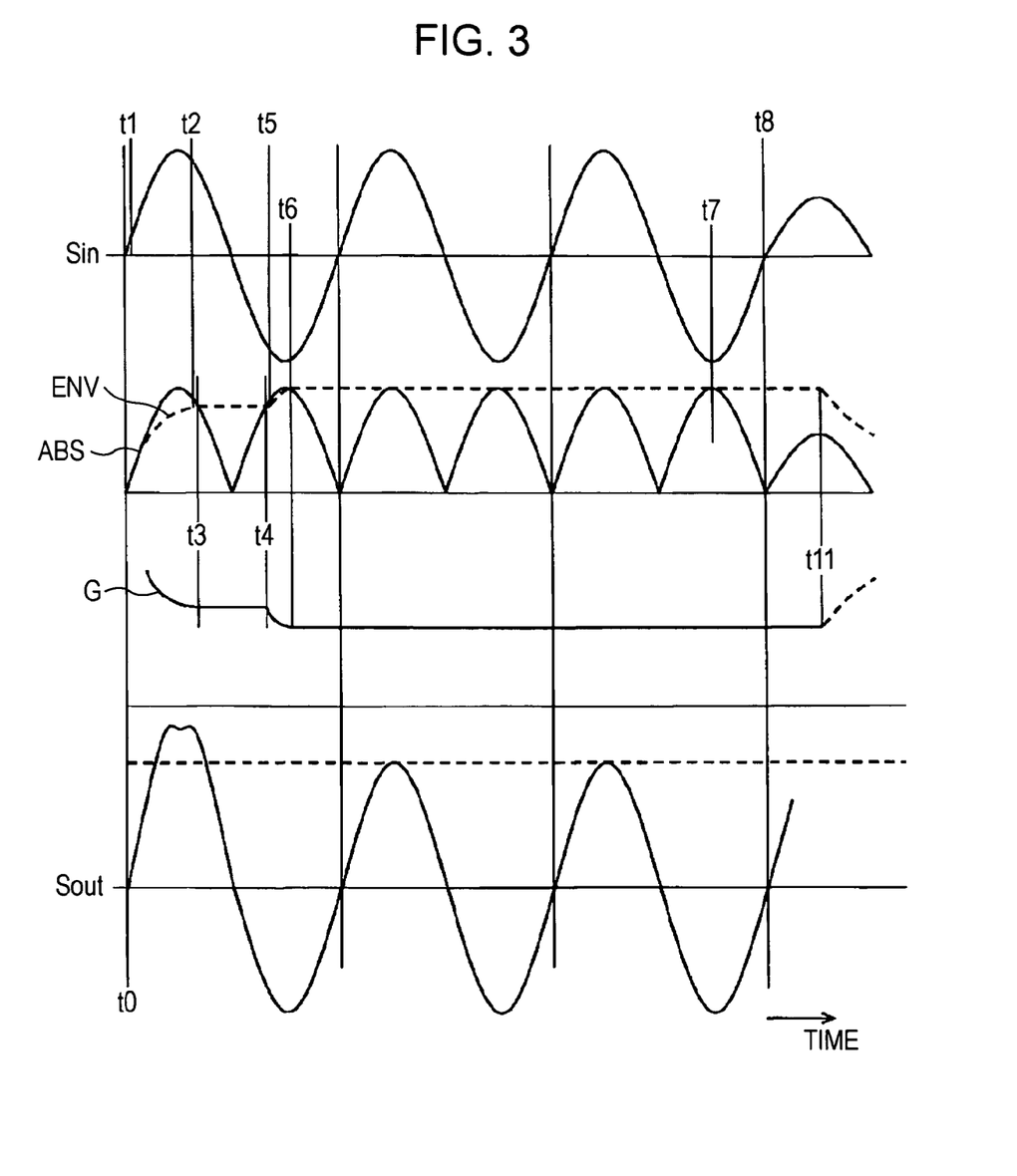
FIG. 3 is a graph showing exemplary signals obtained in the bass enhancing circuit of FIG. 1.

Like FIG. 2, FIG. 3 shows signals obtained in the bass enhancing circuit 10. Up to time point t8, changes in signal level shown in FIG. 3 are exactly the same as those shown in FIG. 2. However, contrary to FIG. 2, FIG. 3 shows an abrupt decrease in the level of the input audio signal Sin at time point t8.

In this case, at time point t11 where the count value C that started increasing at time point t7 reaches the predetermined number N, since the absolute value ABS of the current sample is smaller than the envelope value ENVs obtained at the immediately preceding sample, the envelope value ENV is reduced during a predetermined period of release time, with the count value C held at N.

Hereinafter, this process is referred to as release process. Then, when the absolute value ABS of the current sample reaches the envelope value ENVs obtained at the immediately preceding sample, the count value C is reset to zero and the envelope value ENV is increased through the attack process.

Thus, in a short time, the gain G changes in response to a change in the level of the input audio signal Sin and the effect of enhancing a bass component is recovered.

Figure 4:
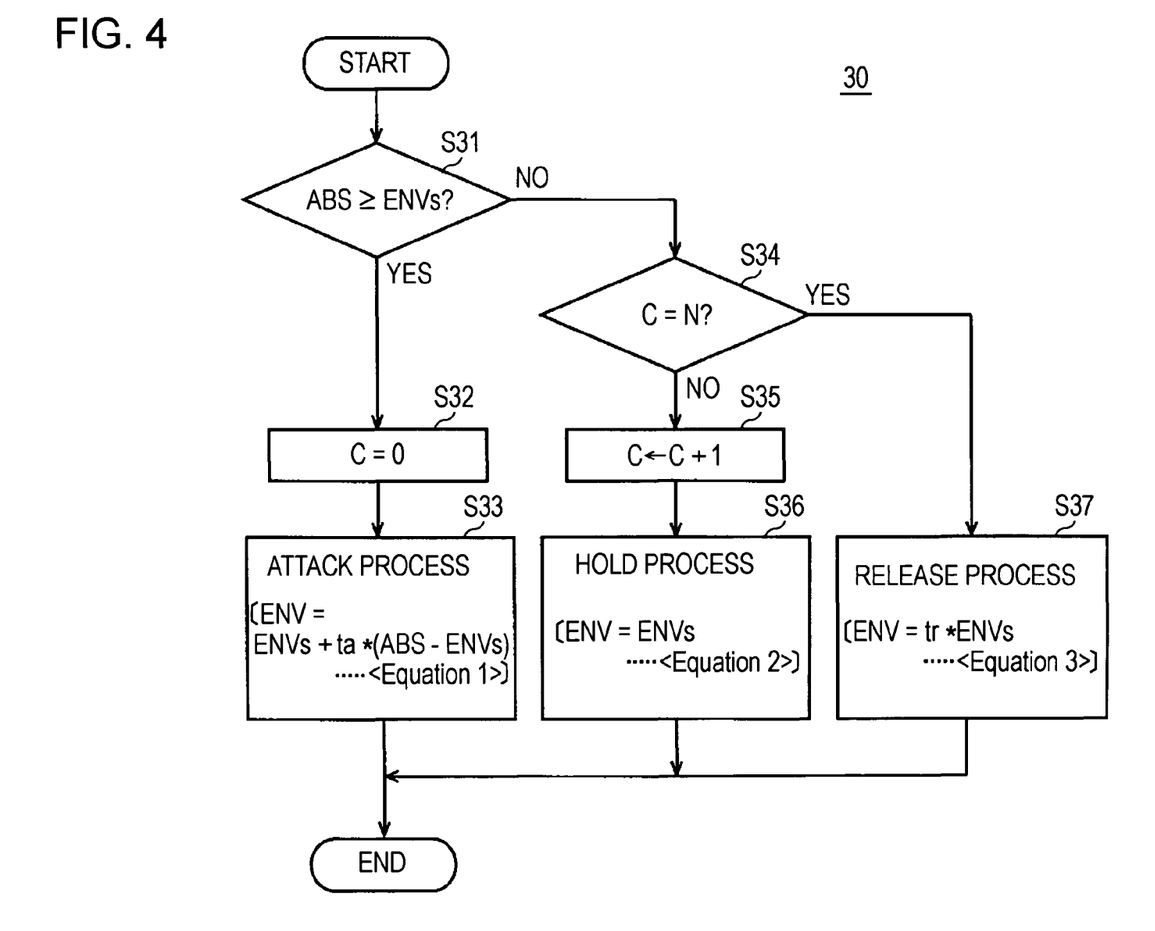
FIG. 4 illustrates an exemplary envelope detection process performed by the bass enhancing circuit of FIG. 1.

FIG. 4 illustrates an example of the above-described envelope detection process executed for each sample of the input audio signal Sin by the envelope detector 17.

In an envelope detection process 30, in step S31, it is determined whether the absolute value ABS of the current sample is greater than or equal to the envelope value ENVs at the immediately preceding sample. As is apparent, the envelope value ENVs is zero immediately after the power is turned on or until the input audio signal Sin is input.

If it is determined in step S31 that the absolute value ABS of the current sample is greater than or equal to the envelope value ENVs at the immediately preceding sample, the process proceeds to step S32, where the count value C is set to zero. Then, the process further proceeds to step S33, where, as an attack process, the envelope value ENV at the current sample is increased as shown by Equation 1 in FIG. 4.

In Equation 1, "ta" represents any constant (e.g., 0<ta<1) which determines attack time. Hereinafter, an asterisk (*) in each equation represents multiplication.

On the other hand, if it is determined in step S31 that the absolute value ABS of the current sample is not greater than or equal to the envelope value ENVs at the immediately preceding sample, in other words, if it is determined in step S31 that the absolute value ABS of the current sample is smaller than the envelope value ENVs at the immediately preceding sample, the process proceeds to step S34, where it is determined whether the count value C reaches the predetermined number N.

Then, if it is determined in step S34 that the count value C does not reach the predetermined number N, the process proceeds to step S35, where the count value C is incremented by one. Then, the process further proceeds to step S36, where, as a hold process, the envelope value ENV at the current sample is held at the envelope value ENVs obtained at the immediately preceding sample, as shown by Equation 2 in FIG. 4.

On the other hand, if it is determined in step S34 that the count value C reaches the predetermined number N, the process proceeds to step S37, where a release process is performed. That is, in step S37, as shown by Equation 3 in FIG. 4, the envelope value ENV at the current sample is reduced, with the count value C held at N. In Equation 3, "tr" represents any constant (e.g., 0<tr<1) which determines release time.

Figure 5:
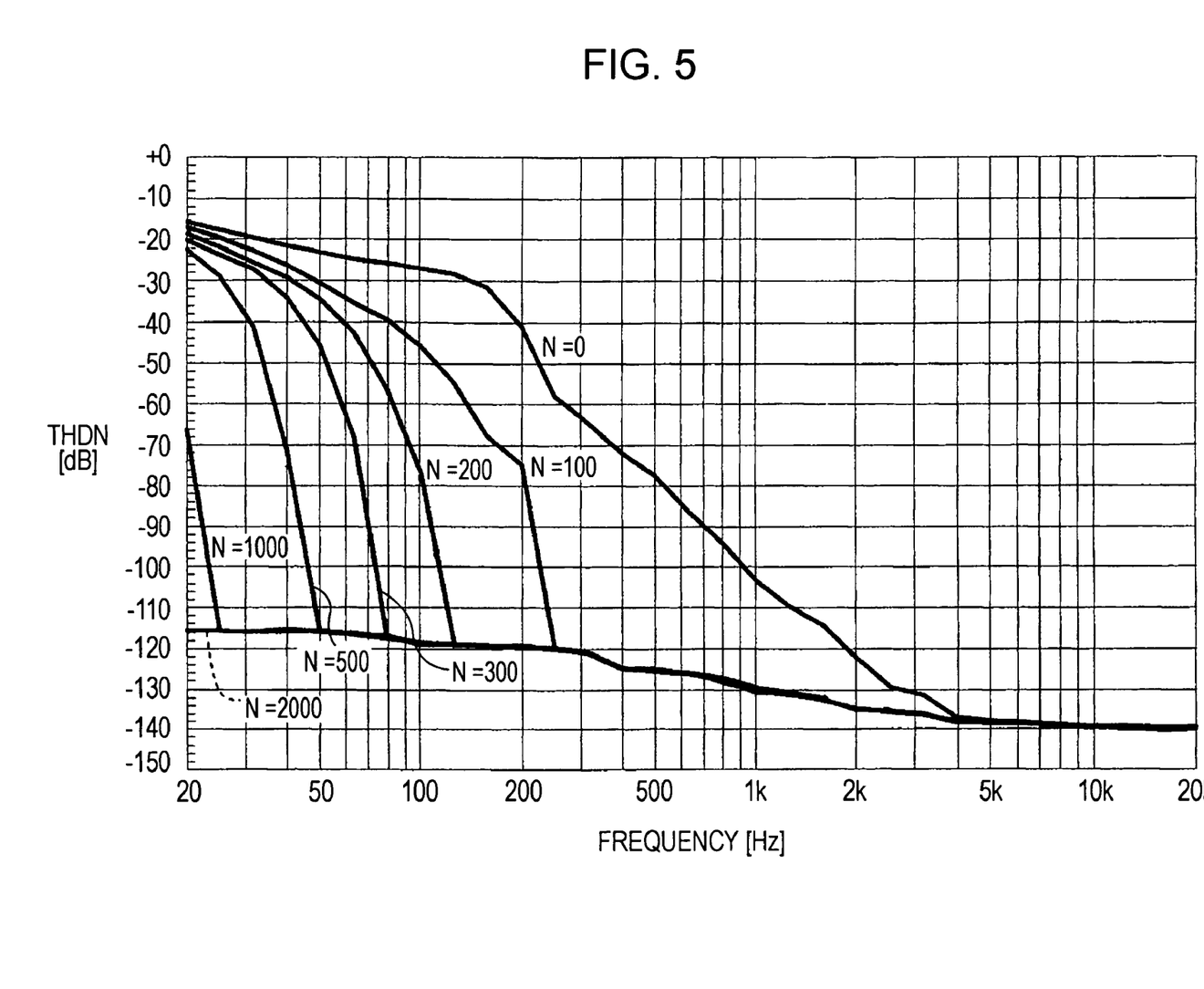
FIG. 5 is a graph showing that a distortion characteristic varies depending on the value of N.

FIG. 5 shows characteristics of total harmonic distortion plus noise (THDN) with respect to frequency, where N=0, N=100, N=200, N=300, N=500, N=1000, and N=2000.

FIG. 5 illustrates the case where the sampling frequency fs of the input audio signal Sin is 44.1 kHz, the low-cut filter 15 is not included in the bass enhancing circuit 10 of FIG. 1, and the audio signal Sog output from the adder 14 is directly extracted as a bass-enhanced output audio signal.

As is apparent from FIG. 5, as the value of N is increased, the distortion level of a reproduced signal at low frequencies is reduced.

However, when the value of N is unnecessarily increased and if the level of the input audio signal Sin abruptly decreases, as in the case of the input audio signal Sin at time point t8 of FIG. 3, it takes a long time before transition to a release process, and thus, it takes a long time before the effect of bass enhancement is seen.

Therefore, it is preferable that the value of N be set according to the lowest reproduction frequency f0 of a speaker. For example, if the lowest reproduction frequency f0 is 100 Hz, the value of N is set to 220 (N=220). That is, it is preferable that the value of N be set such that the higher the lowest reproduction frequency f0, the smaller the value of N, and conversely, the lower the lowest reproduction frequency f0, the greater the value of N. This makes it possible to more effectively perform enhancement of a bass component.

As described above, for example, if the value of N is set to 220 (N=220) where fs=44.1 kHz and f0=100 Hz, a bass component of less than 100 Hz is distorted while a bass component of 100 Hz and above can be enhanced without distortion.

However, as in the case of the example illustrated in FIG. 1, if the low-cut filter 15 is provided and the cutoff frequency thereof is set to be less than or equal to the lowest reproduction frequency f0 of the speaker (i.e., if f0=100 Hz, the cutoff frequency is set to 100 Hz or less), a distorted bass component, such as that described above, can be attenuated.

Figure 6:
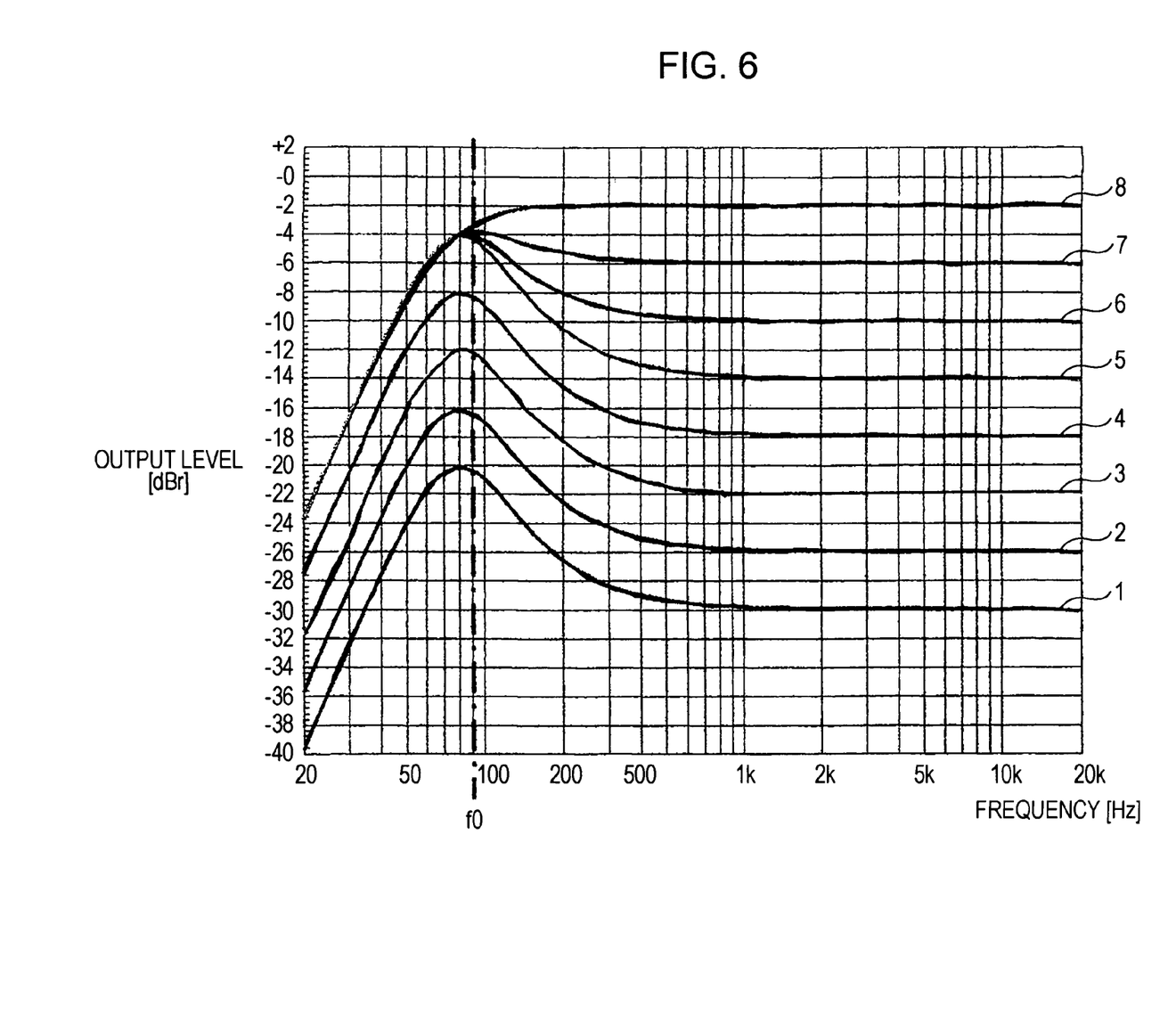
FIG. 6 is a graph showing bass-enhanced frequency characteristics obtained when a low-cut filter is provided.

FIG. 6 shows a frequency characteristic of the output audio signal Sout obtained when a bass component having a frequency equal to or less than the lowest reproduction frequency f0 of a speaker is attenuated by the low-cut filter 15.

Of curves 1 to 8 shown in FIG. 6, curve 1 represents the output audio signal Sout corresponding to the input audio signal Sin with the lowest level, while curve 8 represents the output audio signal Sout corresponding to the input audio signal Sin with the highest level.

As is apparent from this, the lower the input level, the greater the bass component enhancing effect (or gain) and the degree to which a bass component having a frequency equal to or less than the lowest reproduction frequency f0 of a speaker is attenuated by the low-cut filter 15.

Although there has been described the case where a bass-enhanced audio signal is supplied to a speaker and reproduced as sound, the present invention is also applicable to the case where a bass-enhanced audio signal is supplied to headphones or earphones and reproduced as sound.

Figure 7:
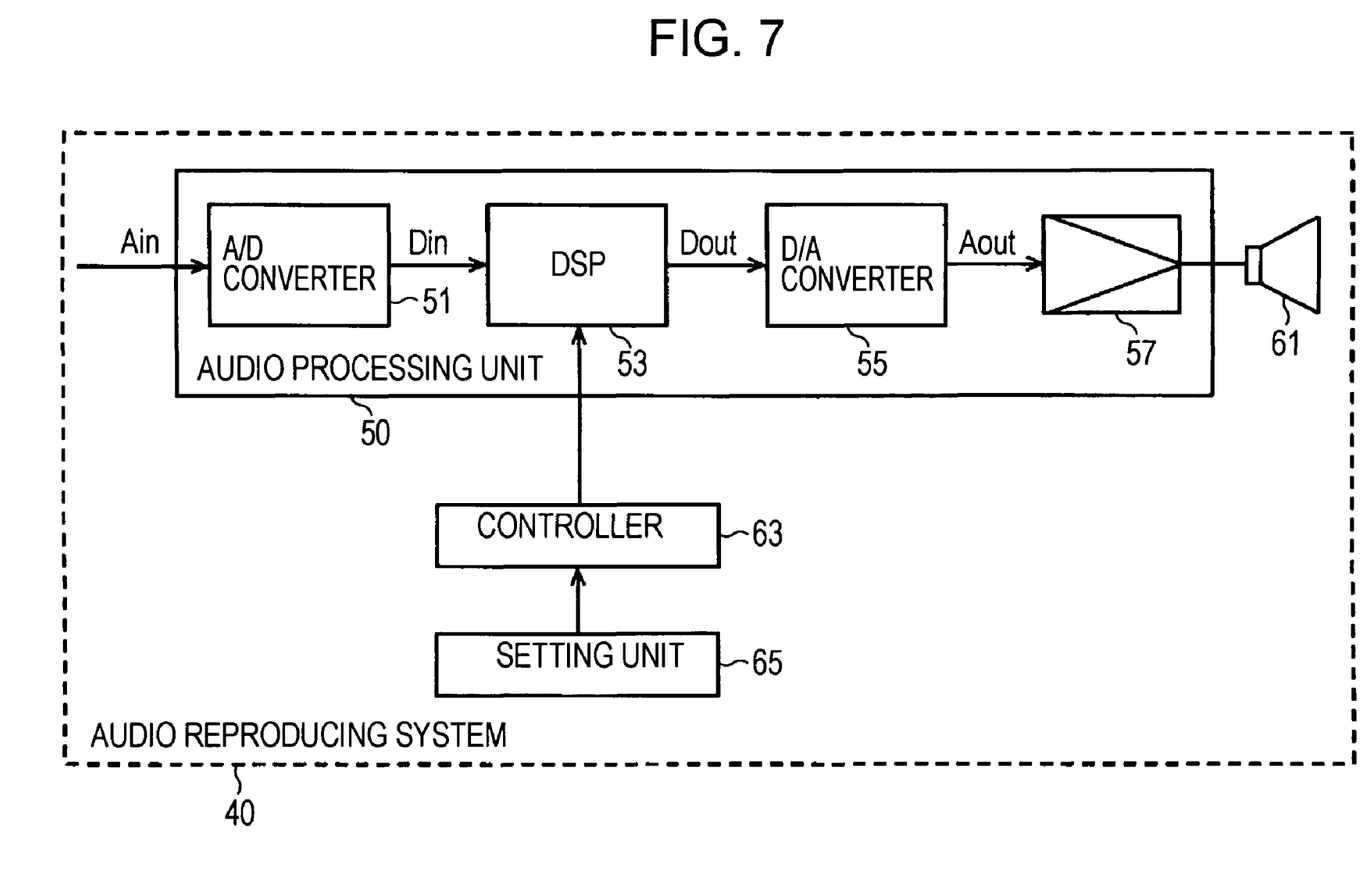
FIG. 7 illustrates an exemplary audio reproducing system according to an embodiment of the present invention.

3. Audio Reproducing System: FIG. 7

FIG. 7 illustrates an exemplary audio reproducing system according to an embodiment of the present invention.

An audio reproducing system 40 of this example includes an audio processing unit 50, a speaker 61 connected to the output side of the audio processing unit 50, a controller 63, and a setting unit 65.

The speaker 61 is a compact speaker included in an active speaker or the like. As shown in FIG. 8, the speaker 61 has a frequency characteristic in which its output level decreases in the frequency range from the lowest reproduction frequency f0 and below. The lowest reproduction frequency f0 (e.g., about 100 Hz) is within an audible frequency range.

The audio processing unit 50 includes an analog-to-digital (A/D) converter 51 for converting an analog audio signal Ain input to the audio processing unit 50 into a digital audio signal Din, a digital signal processor (DSP) 53 for processing the digital audio signal Din, a digital-to-analog (D/A) converter 55 for converting a digital audio signal Dout output as a result of the processing in the DSP 53 into an analog audio signal Aout, and an audio amplifier circuit 57 for amplifying the analog audio signal Aout and supplying the amplified analog audio signal Aout to the speaker 61. Thus, the audio processing unit 50 is configured as a DSP-equipped equalizer amplifier.

Under the control of the controller 63, the DSP 53 serves as the bass enhancing circuit 10 illustrated in FIG. 1 and enhances a bass component as described above. In this case, the digital audio signal Din corresponds to the input audio signal Sin described above, while the digital audio signal Dout corresponds to the output audio signal Sout described above.

Besides, in the audio reproducing system 40 of this example, the setting unit 65 allows selection between a bass enhancement ON mode for performing bass enhancement and a bass enhancement OFF mode for not performing bass enhancement.

For example, if the audio reproducing system 40 includes a subwoofer, as well as the speaker 61, to reproduce bass frequencies, there is no need to enhance a bass component of an audio signal to be supplied to the speaker 61. In such a case, the bass enhancement OFF mode is selected in the setting unit 65.

Additionally, if the bass enhancement ON mode is selected and the DSP 53 serves as the bass enhancing circuit 10 illustrated in FIG. 1, the setting unit 65 allows "selection" or "setting" of a predetermined number N for counting the number of samples and the cutoff frequency of the low-cut filter 15.

Here, the term "selection" refers to the selection of one of a plurality of numerical values or frequencies prepared in advance, while the term "setting" refers to the entry of a specific numerical value or frequency.

Thus, if the speaker 61 having the lowest reproduction frequency f0 of a specific level is replaced with one having the lowest reproduction frequency f0 of another level, the predetermined number N and the cutoff frequency of the low-cut filter 15 can be changed according to the lowest reproduction frequency f0.

Although FIG. 7 illustrates the example in which the speaker 61 is connected to the audio processing unit 50, the present invention is also applicable to the case where headphones or earphones are connected to the audio processing unit 50 constituting the bass enhancing circuit.

It should be understood by those skilled in the art that various modifications, combinations, sub-combinations and alterations may occur depending on design requirements and other factors insofar as they are within the scope of the appended claims or the equivalents thereof.

What is claimed is:
1. A bass enhancing method comprising:
    detecting an envelope of an absolute value of an audio signal; and amplifying a bass component of the audio signal by a gain calculated from an envelope value so as to enhance the bass component of the audio signal, wherein the act of detecting is performed with respect to each sample of a plurality of samples of the audio signal sampled at a predetermined sampling frequency, and the act of detecting comprises:

(a) if the absolute value of a current sample is greater than or equal to a previous envelope value of an immediately preceding sample, a count value C indicating a number of samples is set to zero, while a current envelope value of the current sample is made greater than the previous envelope value at the immediately preceding sample;

(b) if the absolute value of the current sample is smaller than the previous envelope value at the immediately preceding sample and the count value C does not reach a predetermined number N, the count value C is incremented by one and the current envelope value at the current sample is held at the previous envelope value at the immediately preceding sample; and (c) if the absolute value of the current sample is smaller than the previous envelope value at the immediately preceding sample and the count value C reaches the predetermined number N, the current envelope value at the current sample is made smaller than the previous envelope value at the immediately preceding sample.

2. The bass enhancing method according to claim 1, wherein the audio signal subjected to bass enhancement is extracted through a low-cut filter.

3. The bass enhancing method according to claim 2, wherein a cutoff frequency of the low-cut filter is set according to a lowest reproduction frequency f0 of an electric audio transducer to which an output audio signal from the low-cut filter is supplied.

4. The bass enhancing method according to claim 1, wherein the predetermined number N is set according to a lowest reproduction frequency f0 of an electric audio transducer to which the audio signal subjected to bass enhancement is supplied.

5. A bass enhancing circuit comprising:

an absolute value detector configured to detect an absolute value of an audio signal;

an envelope detector configured to detect an envelope of the detected absolute value;

a gain calculator configured to calculate a gain from an envelope value; and a bass enhancing unit configured to enhance a bass component of the audio signal by amplifying the bass component of the audio signal by the calculated gain, wherein, envelope detection is performed by the envelope detector with respect to each sample of a plurality of samples of the audio signal sampled at a predetermined sampling frequency, and envelope detection comprises:

(a) if the absolute value of a current sample is greater than or equal to a previous envelope value of an immediately preceding sample, a count value C indicating a number of samples is set to zero, while the a current envelope value of the current sample is made greater than the previous envelope value at the immediately preceding sample;

(b) if the absolute value of the current sample is smaller than the previous envelope value at the immediately preceding sample and the count value C does not reach a predetermined number N, the count value C is incremented by one and the current envelope value at the current sample is held at the previous envelope value at the immediately preceding sample; and (c) if the absolute value of the current sample is smaller than the previous envelope value at the immediately preceding sample and the count value C reaches the predetermined number N, the current envelope value at the current sample is made smaller than the previous envelope value at the immediately preceding sample.

6. The bass enhancing circuit according to claim 5, further comprising a low-cut filter configured to attenuate a bass component of an output audio signal from the bass enhancing unit.

7. The bass enhancing circuit according to claim 6, wherein a cutoff frequency of the low-cut filter is set according to a lowest reproduction frequency f0 of an electric audio transducer to which an output audio signal from the low-cut filter is supplied.

8. The bass enhancing circuit according to claim 6, further comprising a unit that allows selection or setting of a cutoff frequency of the low-cut filter.

9. The bass enhancing circuit according to claim 5, wherein the predetermined number N is set according to a lowest reproduction frequency f0 of an electric audio transducer to which an output audio signal from the bass enhancing unit is supplied.

10. The bass enhancing circuit according to claim 5, further comprising a unit that allows selection or setting of the predetermined number N.

11. An audio reproducing system comprising:

a bass enhancing circuit; and an electric audio transducer to which an output audio signal from the bass enhancing circuit is supplied, wherein the bass enhancing circuit includes an absolute value detector configured to detect an absolute value of an audio signal;

an envelope detector configured to detect an envelope of the detected absolute value;

a gain calculator configured to calculate a gain from an envelope; and a bass enhancing unit configured to enhance a bass component of the audio signal by amplifying the bass component of the audio signal by the calculated gain, wherein, envelope detection is performed by the envelope detector with respect to each sample of a plurality of samples of the audio signal sampled at a predetermined sampling frequency, and envelope detection comprises:

(a) if the absolute value of a current sample is greater than or equal to a previous envelope value at the immediately preceding sample, a count value C indicating a number of samples is set to zero, while the a current envelope value at the current sample is made greater than the previous envelope value at the immediately preceding sample;

(b) if the absolute value of the current sample is smaller than the previous envelope value at the immediately preceding sample and the count value C does not reach a predetermined number N, the count value C is incremented by one and the current envelope value at the current sample is held at the previous envelope value at the immediately preceding sample; and (c) if the absolute value of the current sample is smaller than the previous envelope value at the immediately preceding sample and the count value C reaches the predetermined number N, the current envelope value at the current sample is made smaller than the previous envelope value at the immediately preceding sample.

* * * * *